United States Patent [19]

Lo

[11] Patent Number: 5,667,630
[45] Date of Patent: Sep. 16, 1997

[54] LOW CHARGE-UP REACTIVE ION METAL ETCH PROCESS

[75] Inventor: Jui-Cheng Lo, Hsin-Chu, Taiwan

[73] Assignee: Vanguard International Semiconductor Corporation, Hsinchu, Taiwan

[21] Appl. No.: 430,468

[22] Filed: Apr. 28, 1995

[51] Int. Cl.$^6$ .................................................. H01L 21/00
[52] U.S. Cl. .......................... 438/653; 216/67; 216/70; 438/654
[58] Field of Search ............... 156/625.1, 643.1, 156/644.1, 646.1, 345 V, 345 P, 345 MW, 345 ME, 345 MG, 651.1; 118/723 R, 723 MR, 723 MA; 437/228; 216/67, 70

[56] References Cited

U.S. PATENT DOCUMENTS

| | | | |
|---|---|---|---|
| 5,094,712 | 3/1992 | Becker et al. | 156/643 |
| 5,259,922 | 11/1993 | Yamano et al. | 156/643 |
| 5,266,154 | 11/1993 | Tataumi | 156/643 |
| 5,277,751 | 1/1994 | Ogle | 156/643 |
| 5,411,631 | 5/1995 | Hori et al. | 216/72 |
| 5,543,362 | 8/1996 | Wu | 437/200 |

OTHER PUBLICATIONS

VLSI Technology by SM SZE 2$^{nd}$ Edition, pub by McGraw-Hill Singapore 1988 pp. 216–217.

*Primary Examiner*—Nam Nguyen
*Assistant Examiner*—Luz Alejandro
*Attorney, Agent, or Firm*—George O. Saile; Alek P. Szecsy

[57] ABSTRACT

A method for forming metal patterns through use of a multi-step magnetically assisted reactive ion etch plasma process. A metal layer is formed upon a semiconductor substrate. The metal layer is patterned with a photoresist composition which leaves exposed those regions of metal to be removed. The exposed metal is removed through a multi-step magnetically assisted reactive ion etch process. The first etch step is a primary metal etch at elevated levels of radio frequency power and magnetic field strength. The last etch step is a secondary metal over-etch step at lower levels of radio frequency power and magnetic field strength. Intermediate to the first etch step and last etch step are a multiplicity of etch process steps where the radio frequency power and magnetic field strength are independently and sequentially reduced.

21 Claims, 5 Drawing Sheets

FIG. 3D

LOW CHARGE-UP REACTIVE ION METAL ETCH PROCESS

BACKGROUND OF THE INVENTION

1. Field of the Invention

This invention relates to a method for etching and patterning a metal layer used in integrated circuit device fabrications. More particularly, this invention relates to a magnetically assisted reactive ion etch method for patterning a metal layer used in integrated circuit device fabrications, whereby a residue free patterned metal layer is formed without electrical charge up and explosion of the patterned metal layer.

2. Description of Related Art

A common feature in the production of integrated circuit devices is the use of metal deposition processes for the definition and fabrication of conductive pathways which connect various circuit elements.

Conventional metallization processes for the production of these conductive pathways have typically included a metal lift-off lithographic process whereby a photosensitive composition is first coated onto a semiconductor surface. The photosensitive composition is then masked, exposed to radiation and developed via an appropriate physical or chemical process to yield a final pattern of photoresist areas which define the locations on the semiconductor surface desired to be absent of metallization.

Subsequent to this photoresist patterning, a metal layer is deposited over both the exposed semiconductor surface areas and the patterned photoresist areas. In order to provide the final desired metallization pattern, the photoresist is then dissolved, removing with it the undesired metal layer which was deposited on the surface of the photoresist. Through this indirect metal lift-off process a metal pattern is provided on a semiconductor surface.

An unfortunate consequence of the indirect metal lift-off process for semiconductor surface metallizations is the production of substantial quantities of residual metal particulate upon dissolution of the photoresist upon which the metal has been deposited. These metal particles can easily redeposit onto adjoining semiconductor surfaces during the lift-off process, thus providing opportunities for voids or other semiconductor device fabrication defects.

As semiconductor device fabrication technology has matured and semiconductor device dimensions have decreased, alternatives to metal lift-off methods for semiconductor device metallization have evolved. A common alternative to the metal lift-off process is a metal etch process wherein the photolithographic definition of conductive metal pathways occurs by direct patterning of a metal layer which has already been deposited upon a semiconductor surface.

In this direct method for metal pattern formation, a photoresist is deposited, exposed and developed upon a previously deposited metal layer to yield a pattern of photoresist features which define the pattern of metal features to remain on the semiconductor surface. The exposed metal remaining between the developed photoresist features may then be etched away from the semiconductor surface through an appropriate chemical or physical etch process. Within this direct method for metal pattern formation, there are several choices of direct metal etch processes which, unlike the lift-off process, are not inherently susceptible to production of substantial quantities of particulate.

One of the more advanced methods used to directly etch metals from semiconductor surfaces without particulate formation is a Reactive Ion Etch (RIE) plasma process. Such plasmas are formed within a carefully designed reactor chamber by the exposure of appropriate gases to radio frequency energy. The gases must be chosen with specific consideration to the metal desired to be etched. In particular, the product obtained from the reaction between the gas plasma and the metal surface must be sufficiently volatile to be removed from the metal surface by the reactor system.

In the practice of reactive ion etching of a metal surface, the reactive gases are introduced into the reactor chamber at reduced pressure. The chamber is then energized through the introduction of Radio Frequency (RF) energy, which allows the reactive gases to transform into reactive species which in turn etch the exposed metal surfaces. Given an appropriate choice of metal etching parameters, metal etching will then occur without the formation of metal particles which can redeposit onto semiconductor surfaces.

Although the RIE process for plasma etching of metal layers can easily proceed in a contamination free fashion, it can nonetheless also be a comparatively slow method for removing exposed metal layers of substantial thicknesses. In order to provide more efficient removal of thick metal layers it has been found useful to increase the plasma density and enhance etch rates through introduction into the reaction chamber of a magnetic field which focuses and intensifies the RIE plasma species at the metal surface desired to be etched. Processes which accomplish this goal include Magnetically Enhanced Reactive Ion Etch (MERIE) processes and Electron Cyclotron Resonance (ECR) processes.

Although the provision of magnetic assistance provides enhanced etch rates of MERIE and ECR processes compared to RIE processes, it is nonetheless important that the magnetically assisted metal etching process not proceed at high rates at or near the final thicknesses of metal layer to be removed. Rapid metal removal rates at this endpoint may yield significant damage to surrounding unetched metal or other adjoining materials within the semiconductor device construction.

In order to provide adequate metal removal rate control near the endpoints of MERIE and ECR metal etch processes, it is common practice in the art to divide a MERIE or ECR metal etch process into a two step process. The first step is a main or primary metal etch whose etch parameters include radio frequency power and magnetic field strength of sufficient magnitude to quickly and effectively remove approximately all of the metal layer. This high power and high field strength primary metal etch is followed by a secondary metal over-etch process at substantially reduced power and field strength. The purpose of this secondary metal over-etch is to completely remove the metal layer and any other residues without damaging the surrounding semiconductor device structure.

Typically, the choice of radio frequency powers and magnetic field strengths for primary MERIE and ECR metal etches are approximately twice the equivalent values for the secondary metal over-etches. The magnitude of these changes in value is substantial. If these substantial changes are effected abruptly, damage may occur to the metal surface being etched. For example, it has been found that simultaneously and abruptly lowering both the radio frequency power and magnetic field strength for primary MERIE metal etches of semiconductor surfaces which contain multiple unconnected metallizations may cause those metallizations to experience unpredictable accumulations of electrical charge, causing them to explode and burst apart at unpredictable intervals.

It is thus the intent of this invention to provide a simple magnetically assisted multi-step metal etch process which provides residue free metallization patterns not susceptible to electrical charge up and explosion at the point of transition from a high radio frequency power and high magnetic field strength primary metal etch process step to a lower radio frequency power and lower magnetic field strength secondary metal over-etch process step. Although both MERIE and ECR processes are well known in the art of semiconductor metal etch processes, the art teaches neither the presence of a metal charge up and explosion problem associated with those processes nor a method to avoid that problem.

SUMMARY OF THE INVENTION

A first object of the present invention is to provide a simple and effective magnetically assisted multi-step metal etch method for forming a residue free etched metal pattern on a semiconductor surface, which method does not cause electrical charging and subsequent explosion within the etched metal pattern.

A second object of the present invention is to provide a magnetically assisted multi-step metal etch method in accord with the first object of the present invention, which method is also readily manufacturable.

In accord with the objects of the present invention, a new multi-step magnetically assisted metal etch method is provided for forming a residue free etched metal pattern on a semiconductor surface without electrical charging and subsequent explosion within the etched metal pattern.

The new method begins by forming a metal layer over a semiconductor surface. Upon the metal layer is then formed a patterned etch mask which protects the portions of the metal layer which are to remain on the semiconductor surface. The metal pattern exposed through the etch mask is then exposed to a primary etching through a high radio frequency power and high magnetic field strength magnetically assisted reactive ion etch plasma appropriate for the metal layer. After the primary etching, the metal pattern is exposed to a multiplicity of intermediate plasma etching steps through sequentially and independently lowering the high radio frequency power and high magnetic field strength of the primary etching to a low radio frequency power and low magnetic field strength. Finally, a secondary over-etching of the metal pattern exposed through the etch mask is provided at the low radio frequency power and low magnetic field strength.

The magnetically assisted reactive ion etch plasma of the present invention may be provided in a minimum of two embodiments. In a first embodiment, the magnetically assisted reactive ion etch plasma is a Magnetically Enhanced Reactive Ion Etch (MERIE) plasma. In a second embodiment, the magnetically assisted reactive ion etch plasma is an Electron Cyclotron Resonance (ECR) plasma.

The method of the present invention is simple and effective. The sequential and independent stepped reduction of radio frequency power and magnetic field strength from a high radio frequency power and high magnetic field strength primary metal etch to a low radio frequency power and low magnetic field strength secondary metal over-etch provides a more gentle transition in magnetically assisted plasma etching conditions than is known in the art. This gentle transition provides a magnetically assisted plasma etching environment where delicate and intricate features on semiconductor surfaces do not become electrically charged to the point where they explode. Such explosions can cause significant contamination within plasma etching chambers and provide substantial semiconductor yield losses.

The method of the present invention is also readily manufacturable. At a point nearing the end of a primary etch of a metal pattern exposed through an etch mask, the radio frequency power and the magnetic field strength are independently and sequentially reduced, over a series of several steps, to reach the final secondary over-etch conditions for the metal layer.

The number of steps in the sequential reduction of the radio frequency power and magnetic field strength must be a minimum of two. However, a process encompassing a larger number of steps with a smaller magnitude of reduction of either the radio frequency power or magnetic field strength at each step may also be used. Typically, the radio frequency power and the magnetic field strength for the secondary metal over-etch process will be approximately one half the corresponding values of those parameters for the primary metal etch process. Neither the magnitude of change in the radio frequency power and the magnetic field strength, nor the multiplicity of process steps to be taken in changing those parameters, presents manufacturing difficulties.

Using this step-wise reduction of radio frequency power and magnetic field strength for the magnetically assisted reactive ion etching of metals provides residue free etched metal patterns where intricate features formed within those patterns are not susceptible to electrical charging during the transition from the primary metal etch to the secondary metal over-etch. Thus, the intricate features are not susceptible to explosion.

BRIEF DESCRIPTION OF THE DRAWINGS

The accompanying drawings, which form a material part of this description, show the following.

FIG. 2a to FIG. 2g show a series of cross-sectional schematic diagrams of a metallized semiconductor substrate corresponding to the process steps of the present invention.

FIG. 3a to FIG. 3d show schematic diagrams of patterned metal surfaces illustrating the value of the present invention.

DESCRIPTION OF THE PREFERRED EMBODIMENTS

Figure 1:
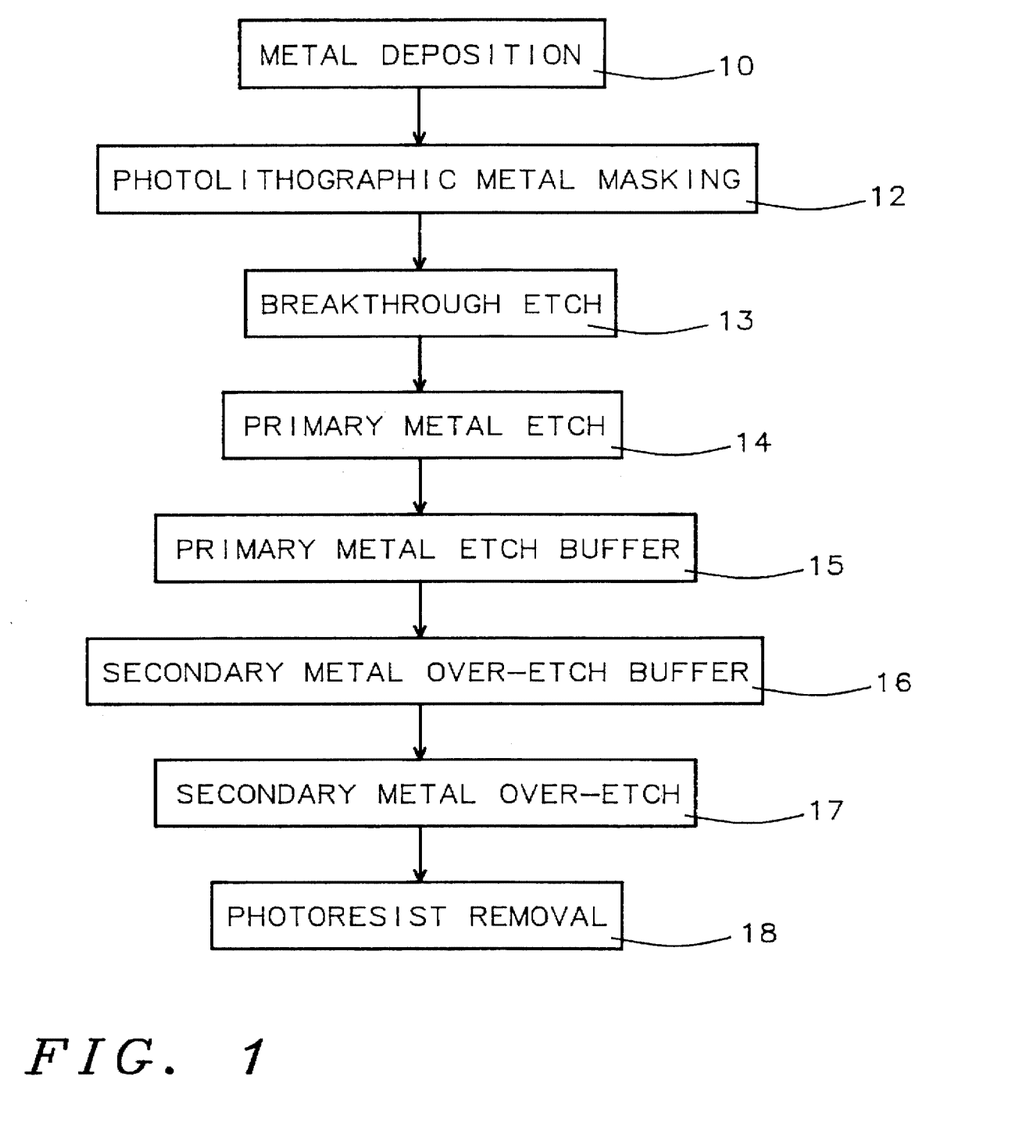
FIG. 1 shows the process steps in the preferred method of the present invention.

Referring to FIG. 1, there is shown the outline of process steps in the preferred method of the present invention. Corresponding with FIG. 1, FIG. 2a to FIG. 2g show a series of cross-sectional schematic diagrams of a semiconductor substrate upon which the preferred method of the present invention has been practiced. The method of the present invention may be practiced through a minimum of two preferred embodiments. In a first preferred embodiment, the magnetically assisted reactive ion etch plasma method of the present invention employs a Magnetically Enhanced Reactive Ion Etch (MERIE) plasma. In a second embodiment, the magnetically assisted reactive ion etch plasma method employs an Electron Cyclotron Resonance (ECR) plasma.

The method described by the present invention may be used in forming the contact metallurgy of a semiconductor substrate or forming any subsequent patterned metal layer upon a semiconductor substrate. The method of the present invention may be used in forming overlapping metal features as well as adjoining metal features. The metal features formed by this invention may be interconnecting studs as well as conductive stripes. The method of the present invention may be used to form any patterned metal features upon a semiconductor substrate.

Referring to FIG. 1, Step 10 shows the first step in the first preferred embodiment of the present invention. Step 10 shows the metal deposition step. Corresponding to Step 10 is FIG. 2a, which shows a cross-sectional schematic diagram of the metal layers of the present invention formed upon a semiconductor substrate. The metal layers of the present invention may be formed directly upon the surface of a semiconductor substrate, or the semiconductor substrate may have intervening insulator and/or conductor layers upon which the metal layers of the first preferred embodiment of the present invention may be formed.

Figure 2A:
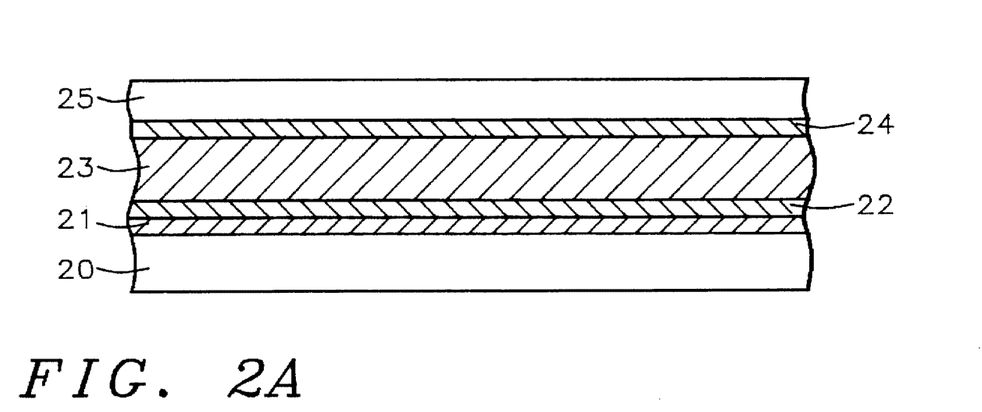

In FIG. 2a there is shown a semiconductor substrate 20 upon which is formed a barrier metal layer 22 over an adhesive layer 21. A conductive metal layer 23 is formed upon the barrier metal layer 22, and an abrasion resistant layer 24 is formed upon the conductive metal layer 23. All of the preceding layers may be formed upon the semiconductor substrate 40 through conventional methods as are known in the art. Such methods include, but are not limited to thermal evaporation methods, electron beam assisted evaporation methods, Chemical Vapor Deposition (CVD) methods and metal sputtering methods.

With regard to the composition of the layers, the adhesive layer 21 is typically a titanium or titanium silicide layer formed upon the semiconductor substrate 20 at several hundred angstroms thickness. The barrier metal layer 22 is typically a titanium nitride layer formed upon the adhesive layer 21 at a few thousand angstroms thickness. The conductive metal layer 23 is typically an aluminum, aluminum alloy or copper layer formed upon the barrier metal layer 22 at several thousand angstroms thickness. Finally, the abrasion resistant layer 24 is typically an aluminum oxide, titanium, titanium-nitride or titanium-tungsten layer formed upon the conductive metal layer 23 at a few thousand angstroms thickness.

For the first preferred embodiment of the present invention, the adhesive layer 21 is preferably titanium metal formed upon the semiconductor substrate 20 at about 300 angstroms. The barrier metal layer 22 is preferably titanium nitride formed upon the adhesive layer 21 at about 1500 angstroms. The conductive metal layer 23 is preferably an aluminum-copper-silicon alloy formed upon the barrier metal layer 22 at about 3000 to about 15000 angstroms. Finally, the abrasion resistant layer 24 is preferably a titanium nitride layer formed upon the conductive metal layer 23 at several thousand angstroms thickness.

Many other conductive materials may be patterned through the process of the present invention. Such materials include tungsten, platinum, highly doped silicon, metal silicides and related conductive metal alloys. As is know in the art, there are many other conductive materials which may be formed upon a semiconductor substrate and patterned through the process of the present invention.

Figure 2B:
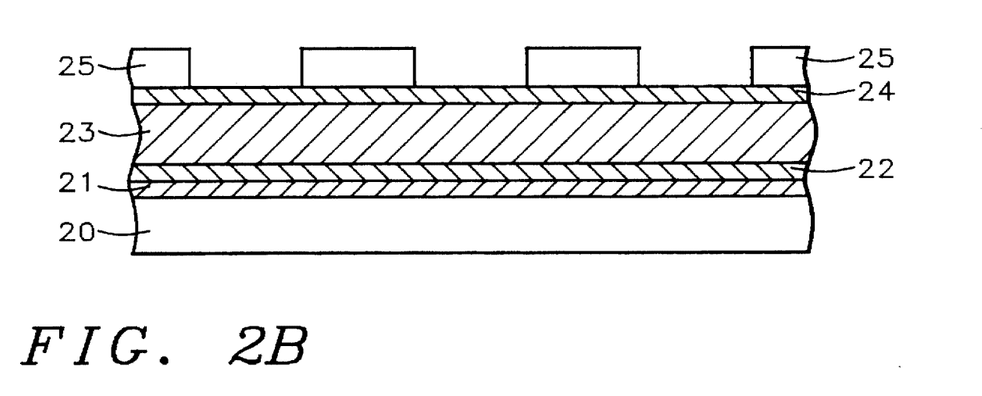

Referring again to FIG. 1, Step 12 shows the next step in the first preferred embodiment of the present invention. Step 12 shows the photolithographic metal masking step. Corresponding with Step 12 are FIG. 2a and FIG. 2b. As shown in FIG. 2a, the first step within the photolithographic metal masking is forming a photoresist layer 25 upon the surface of the abrasion resistant layer 24. Subsequently, the photoresist layer 25 is exposed and developed to yield the patterned photoresist layer 25 upon the abrasion resistant metal layer 24, as shown in FIG. 2b.

There are several photoresists and photolithographic metal masking techniques known in the art which are applicable to the present invention. The techniques often utilize different types or strengths of radiative energy to cure different types of photoresist materials. Most commonly, the size of the desired metal feature will determine the type of photoresist and exposure conditions to be applied in the practice of the present invention.

Although this invention may be practiced with any of several photolithographic techniques, it is preferred that this invention be practiced with a photoresist which, after patterning, is not susceptible to degradation by the reactive gases used to etch the metal layers underlying the photoresist layer 25.

Figure 2C:
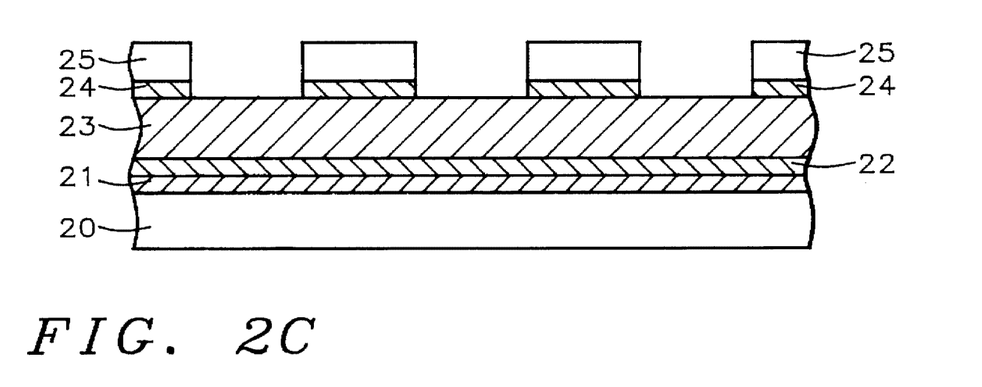

Referring again to FIG. 1 there is shown in step 13 the next step in the first preferred embodiment of the present invention. Step 13 shows the breakthrough etch step. The purpose of the breakthrough etch step is to remove the abrasion resistant layer 24 from the surface of the conductive metal layer 23 to yield the pattern shown in FIG. 2c. The breakthrough etch for removal of the abrasion resistant layer 24 is preferably a RIE etch process. The preferred process parameters for the breakthrough etch are: (1) etchant gas flow rates of 40:10:10 standard cubic centimeters per minute (sccm) for boron trichloride:chlorine:nitrogen, respectively, (2) radio frequency power of 500 watts, and (3) reactor chamber pressure of 30 mtorr. Once the breakthrough etch has removed the abrasion resistant metal layer 24, the critical steps of the etch process of the present invention may proceed.

Referring again to FIG. 1, there is shown in Step 14 the first critical step in the first embodiment of the present invention. Step 14 shows the primary metal etch process. For the first preferred embodiment of the present invention, the primary metal etch process is undertaken through a Magnetically Enhanced Reactive Ion Etch (MERIE) process.

For the aluminum-silicon-copper alloy conductive metal layer 23 of the first preferred embodiment of the present invention, the preferred primary metal etch MERIE process will include etchant gases which are chlorine containing species. The preferred chlorine containing species for aluminum-silicon-copper alloy metal etching are chlorine gas and boron trichloride gas. In addition to these chlorine containing gases, it is also preferred to include a non-reactive diluent gas into the reaction chamber for etching the conductive metal layer 23. There are several choices for non-reactive diluent gases known in the art. Nobel gases such as argon and helium are well known in the art as non-reactive diluents. Other gases may also be used. For reasons of economy, the preferred non-reactive diluent gas for the present composition is nitrogen.

The preferred gas flow rates for the preferred etch gas composition of the present invention are about 10 to about 200 standard cubic centimeters per minute (sccm) boron trichloride flow, about 10 to about 200 sccm chlorine flow, and about 0 to about 150 sccm nitrogen flow. Under these conditions, the preferred thickness of the conductive metal layer 23 may be easily and efficiently etched.

It is further preferred that these gases be introduced into a reaction chamber which is maintained at a pressure of about 0.1 to about 300 mtorr. Total gas flows and chamber pressures in the ranges noted above allow for efficient formation of a MERIE plasma which contains sufficient concentrations of active species for efficient etching of conductive metal layer 23. Reaction chambers maintained at higher pressures may not be able to maintain adequate concentrations of active species needed to efficiently etch the conductive metal layer 23.

The parameters critical to the definition of the MERIE metal etch process of the first preferred embodiment of the present invention are the radio frequency power, the magnetic field strength and the time of exposure of the conductive metal layer 23 to the reactive ion etch conditions. For the primary metal etch process of the present invention, it is preferred that the radio frequency power be in the range of about 20 to about 900 watts, that the magnetic field strength be in the range of about 1 to about 160 gauss, and that the primary etch last for a time sufficient to consume about 40 to about 90 percent of the thickness of the conductive metal layer 23.

Figure 2D:
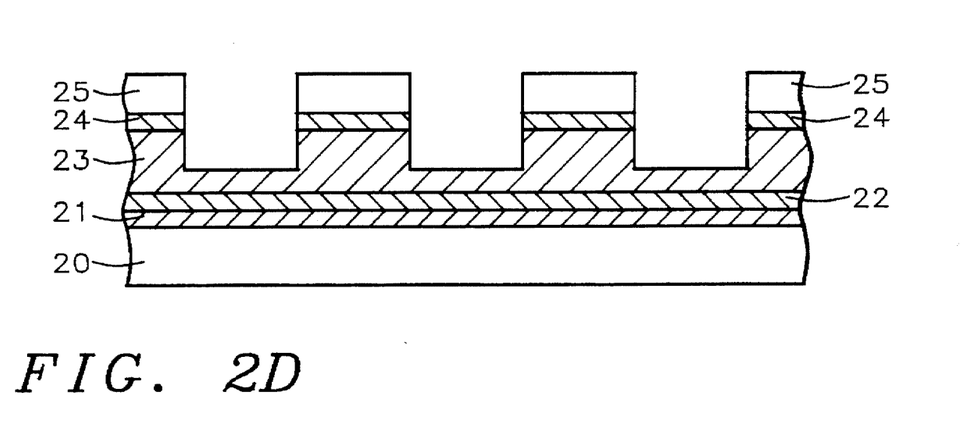

FIG. 2d shows a cross-sectional schematic diagram illustrating the profile of the etched conductive metal layer 23 near the endpoint of the MERIE primary metal etch process of the first preferred embodiment of the present invention. Illustrated within this diagram is the unetched portion of the conductive metal layer 23 remaining between the photomasked portions of the conductive metal layer 23.

Referring again to FIG. 1, there is shown in step 15 the second critical step in the first preferred embodiment of the present invention. Step 15 shows the primary metal etch buffer step. Within the primary metal etch buffer step, either the radio frequency power or the magnetic field strength supplied to the MERIE chamber within the primary metal etch step is reduced to a lower value. The lower value may be at either the secondary over-etch value of that parameter or a value somewhat higher than the secondary over-etch value.

It is critical to the present invention that both the radio frequency power and the magnetic field strength parameters not be reduced simultaneously. It is also critical to the present invention that the magnetic field strength not be reduced to a level of zero gauss.

In practice it is preferred to reduce the radio frequency power first. In practice it is also preferred to reduce the radio frequency power to the approximate midpoint of the radio frequency powers used in the primary metal etch and the secondary metal over-etch. For the practice of the present invention, it is preferred to reduce the radio frequency power to a value of about 300 to about 700 watts in the primary metal etch buffer step.

Referring again to FIG. 1 there is shown in step 16 the third process step critical to the first preferred embodiment of the present invention. Step 16 shows the secondary metal over-etch buffer step. Corresponding with step 16 is the schematic cross-sectional diagram of FIG. 2e. In the secondary metal over-etch buffer step, the parameter which was not adjusted downward in the MERIE primary metal etch buffer step is now adjusted downward. Typically, this step will involve the downward adjustment of the magnetic field strength, since the radio frequency power was preferably adjusted downward in the primary metal etch buffer step.

Figure 2E:
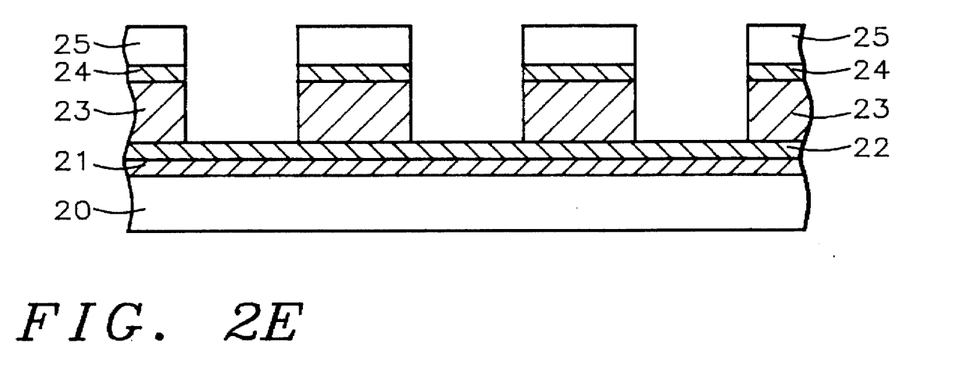

In practice it is preferred in the secondary metal over-etch buffer step of this invention to adjust the magnetic field strength to its final non-zero value to be used in the secondary over-etch. In practice it is preferred that this final secondary over-etch value be about 1 to about 40 gauss. It is also preferred that this secondary metal over-etch buffer step last for a time period of about 10 to about 200 seconds. As shown in FIG. 2e, approximately all of the conductive metal layer 23 will be removed from unmasked portions of the semiconductor substrate 20 upon completion of the secondary metal over-etch buffer step.

Figure 2F:
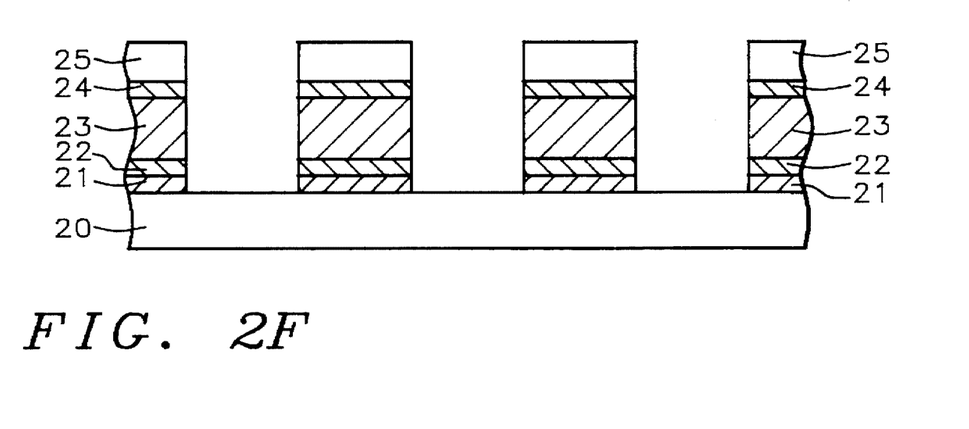

Referring again to FIG. 1, there is shown in step 17 the last critical step in the first preferred embodiment of the present invention. Step 17 shows the secondary metal over-etch step. Corresponding with step 17 is FIG. 2f. Within the MERIE secondary metal over-etch step, it is preferred to reduce the radio frequency power from the intermediate value to which it was adjusted in primary metal etch buffer step to its final value. For the first preferred embodiment of the present invention, the final value of the radio frequency power is preferably from about 20 to about 200 watts. The metallized semiconductor substrate 20 is exposed to these secondary over-etch conditions for about 40 to about 200 seconds in order to provide the residue free patterned metal layers 24 of the present invention, as shown in FIG. 2f.

Referring again to FIG. 1 there is shown in Step 18 the last step in the first preferred embodiment of the present invention. Step 18 shows the photoresist removal step. The process through which the photoresist is removed from the surface of the etched metal features of the present invention is not critical. However, it is usually desirable to remove the photoresist prior to further processing of the metal patterned semiconductor substrate.

Methods for removal of photoresist residues are well known in the art. Such methods include chemical methods involving organic solvents, acids or bases, as well as physical and physicochemical methods which involve ashing or reactive etching techniques. The techniques may be done under vacuum or at atmospheric pressure. As is understood in the art, the choice of photoresist removal technique will depend largely upon the choice of chemical composition of the original photoresist composition.

Figure 2G:
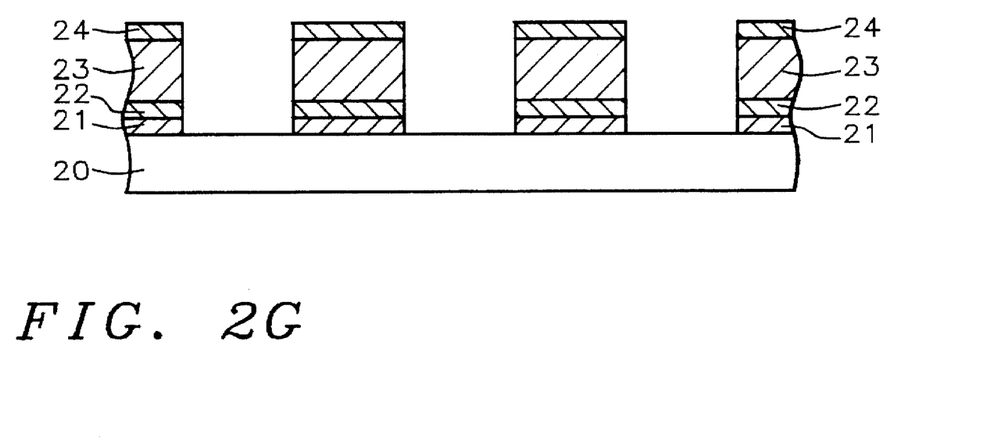

Once having removed the photoresist, the first preferred embodiment of the present invention provides a residue free patterned metal layer, wherein the metal pattern was not susceptible to electrical charge-up and explosion. FIG. 2g shows a schematic cross-sectional diagram corresponding to the residue free patterned metal layer of the present invention.

In addition to the first preferred embodiment of the present invention, there is also a second preferred embodiment of the present invention. The second preferred embodiment differs from the first preferred embodiment only in the choice of magnetically assisted reactive ion etch plasma. For the second preferred embodiment of the present invention the magnetically assisted reactive ion etch plasma is an Electron Cyclotron Resonance (ECR) plasma.

EXAMPLE 1

A semiconductor wafer was coated with metallization layers in accord with the first preferred embodiment of the present invention. Included within the metallization layers was a conductive metal layer formed from aluminum-1% silicon-0.5% copper deposited at a thickness of 8000 angstroms. The metallized surface of the wafer was then coated with a layer of Mitsumishi 7350i Photoresist at a thickness of 2 microns. The photoresist was then developed and exposed using lithographic techniques as are conventional in the art to yield a pattern of unconnected parallel photoresist lines on the surface of the metal. The lines were 10 microns in width and they were separated by 2 micron wide spaces.

The wafer was then placed into a Magnetically Enhanced Reactive Ion Etch (MERLE) chamber and the pressure was reduced to 30 mtorr. A reactive ion etch gas mixture of about 40 sccm boron trichloride, about 10 sccm chlorine and about 10 sccm nitrogen was then introduced into the chamber while the chamber pressure was maintained at 30 mtorr.

Radio frequency power was then introduced into the MERIE chamber at a level of about 500 watts for about 30 seconds. Following this treatment, the metallized and photopatterned wafer was exposed to a primary metal etch at 700 watts radio frequency power and 40 gauss magnetic field strength for 110 seconds. The radio frequency power and magnetic field strength conditions were then both simultaneously reduced to final secondary metal over-etch conditions of 350 watts radio frequency power and 20 gauss magnetic field strength for a time period of 100 seconds.

Figure 3A:
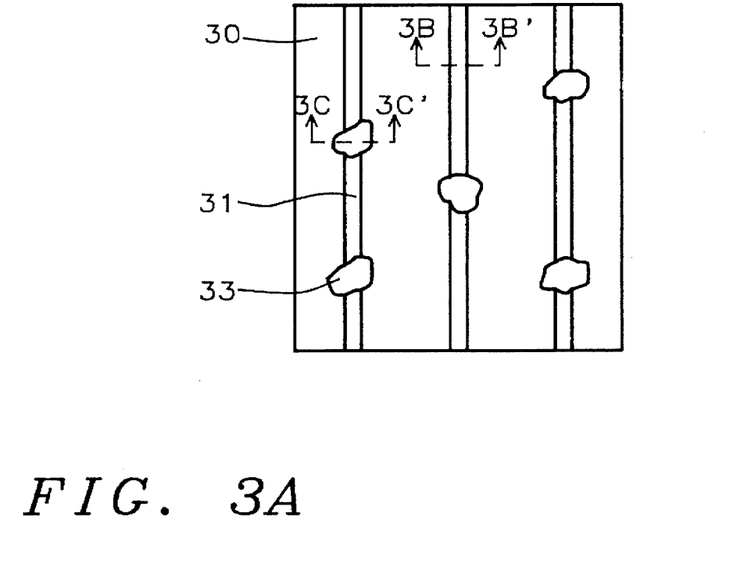

The etched wafer was then removed from the MERIE reactor chamber and the number of explosions occurring within the metal line pattern was counted optically. The density of explosions was approximately 5 to 500 per square centimeter of wafer surface. FIG. 3a shows a schematic plan-view diagram of a portion of the wafer surface after exposure to the MERIE metal etch process of this Example. Within FIG. 3a, the photoresist coated metallization lines 30 are separated by etched spacer lines 31. The explosions 33 occur between adjoining photoresist coated metallization lines 30.

Figure 3B:
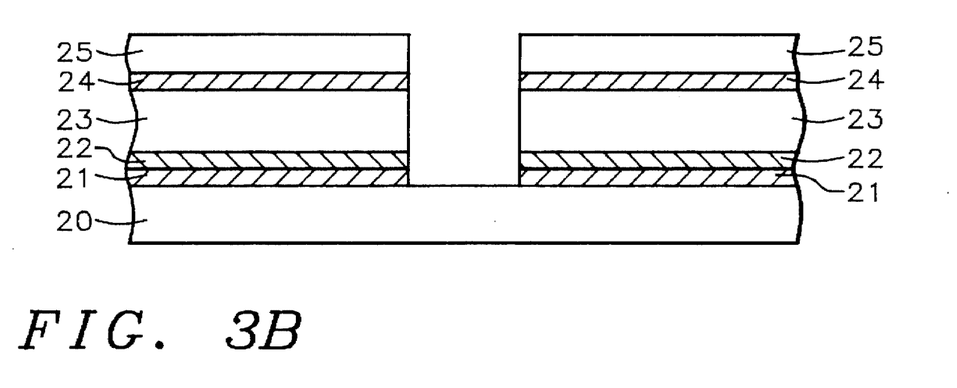
Figure 3C:
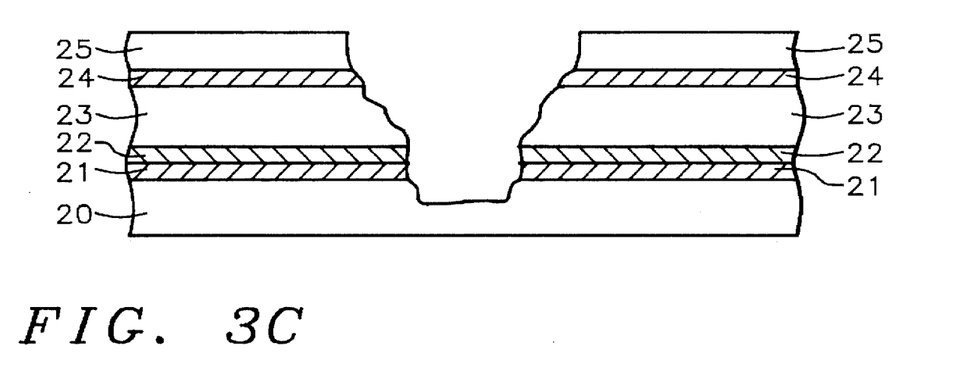

FIG. 3b corresponds to the cross-sectional view taken through the B:B plane of the metallized and phototresist coated semiconductor substrate shown in FIG. 3a. The B:B plane includes a portion of the metallization layers through which there was no explosion. FIG. 3c corresponds to the cross-sectional view taken through the C:C plane of the metallized and photoresist coated semiconductor substrate shown in FIG. 3a. The C:C plane includes a portion of the metallization layers through which an explosion 33 occurred.

Within FIG. 3b and FIG. 3c, the semiconductor substrate 20 has formed upon its surface the multi-layer metallization stack consisting of the adhesive layer 21, the barrier metal layer the conductive metal layer 23 and the abrasion resistant layer 24. Coated upon these layers is the photoresist layer 25. In comparison with FIG. 3b, FIG. 3c shows the erosion of the metal layers and the photoresist layer as a consequence of charging up and explosion between the adjoining photoresist coated metallization lines 30 of FIG. 3a.

EXAMPLE 2

A second semiconductor wafer was prepared using the same conditions for the metal coating, photoresist coating and photo-developing processes of the wafer surface described in Example 1. The wafer was also exposed to the same concentrations and composition of metal etch gas. However, the radio frequency power and magnetic field strength parameters for the MERIE metal etch process practiced within this Example differed significantly from the magnetically enhanced reactive ion etch metal etch process used in Example 1.

The MERIE metal etch process of this Example approximated the process described within the first preferred embodiment of the present invention. Specifically, the MERIE metal etch process of this Example began with a primary metal etch process at 700 watts radio frequency power and 40 gauss magnetic field strength for a time period of 80 seconds. This primary etch was followed by a primary metal etch buffer step at conditions of 500 watts radio frequency power and 40 gauss magnetic field strength for 40 seconds. The primary metal etch buffer step was followed by a secondary metal over-etch buffer step at conditions of 500 watts radio frequency power and 20 gauss magnetic field strength for 30 seconds. Finally, the wafer was exposed to a secondary metal over-etch step at conditions of 350 watts radio frequency power and 20 watts magnetic field strength for a time period of 30 seconds.

Figure 3D:
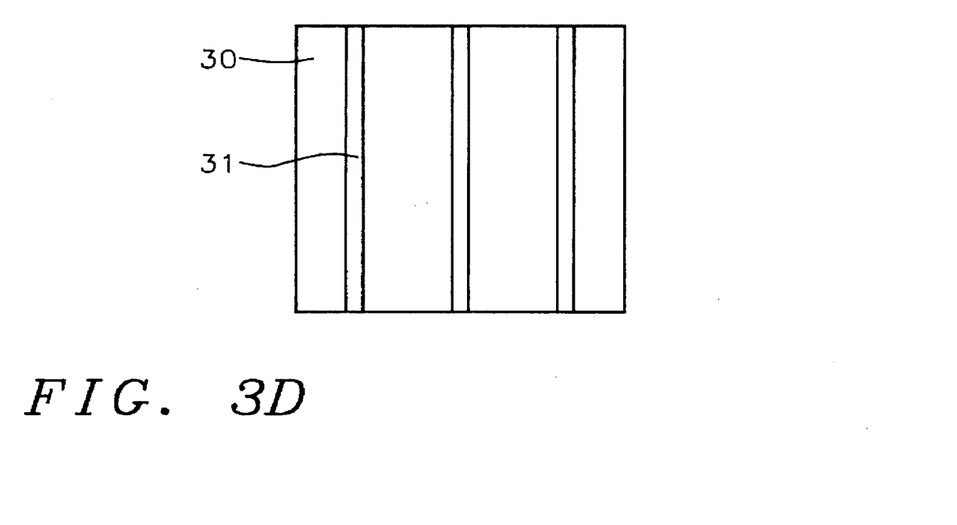

Similarly to the inspection process used in Example 1, the surface of the wafer of this Example was also examined after the secondary metal over-etch process for the presence of explosions or deterioration within the pattern of metal lines. In this Example, no defects were found within those metal lines. A schematic diagram of the patterned metal surface provided by this Example is shown in FIG. 3d. Within FIG. 3d there is shown photoresist coated metallization lines 30 separated by etched spacer lines 31. Absent from FIG. 3d are the explosions 33 shown in FIG. 3a.

Through comparison of the surfaces of the wafers processed in accord with Example 1 and Example 2, as shown by FIG. 3a and FIG. 3d, it is clear that the multi-step sequential MERIE metal etch process of the present invention provides a residue free patterned metal layer which is not susceptible to charge up and explosion.

What is claimed is:

1. A method for forming a residue free patterned metal layer for semiconductor device applications comprising:

forming a metal layer upon a semiconductor substrate;

providing a patterned etch mask over the metal layer, which mask protects portions of the metal layer which are to remain on the semiconductor substrate;

providing a primary etching of the metal layer exposed through the etch mask through the use of a magnetically assisted reactive ion etch plasma, the primary etching being controlled by a first radio frequency power and a first magnetic field strength of the magnetically assisted reactive ion etch plasma;

providing a multiplicity of intermediate etching steps of the metal layer exposed through the etch mask by sequentially and independently lowering the first radio frequency power and the first magnetic field strength of the magnetically assisted reactive ion etch plasma to a second radio frequency power and a second magnetic field strength of the magnetically assisted reactive ion etch plasma; and providing a secondary over-etching of the metal layer exposed through the etch mask at the second radio frequency power and the second magnetic field strength of the magnetically assisted reactive ion etch plasma.

2. The method of claim 1 wherein the metal layer is formed from a metal selected from the group consisting of aluminum and aluminum alloys.

3. The method of claim 1 wherein the metal layer is formed from copper.

4. The method of claim 2 wherein the metal layer has a thickness from about 0.3 to about 1.5 microns.

5. The method of claim 1 wherein the secondary over-etching of the metal layer is undertaken at a value of the second magnetic field strength.

6. The method of claim 5 wherein the multiplicity of intermediate etching steps is initiated by a reduction of the first radio frequency power.

7. The method of claim 5 wherein the multiplicity of intermediate etching steps is initiated by a reduction of the first magnetic field strength.

8. A method for forming a residue free patterned aluminum containing metal layer for semiconductor device applications comprising:

forming an aluminum containing metal layer upon a semiconductor substrate;

providing a patterned etch mask over the aluminum containing metal layer, which mask protects portions of the aluminum containing metal layer which are to remain on the semiconductor substrate;

providing a primary etching of the aluminum containing metal layer exposed through the etch mask through the use of a Magnetically Enhanced Reactive Ion Etch plasma, the primary etching being controlled by a first radio frequency power and a first magnetic field strength of the Magnetically Enhanced Reactive Ion Etch plasma;

providing a multiplicity of intermediate etching steps of the aluminum containing metal layer exposed through the etch mask by sequentially and independently lowering the first radio frequency power and the first magnetic field strength of the Magnetically Enhanced Reactive Ion Etch plasma to a second radio frequency power and a second magnetic field strength of the Magnetically Enhanced Reactive Ion Etch plasma; and providing a secondary over-etching of the aluminum containing metal layer exposed through the etch mask at the second radio frequency power and the second magnetic field strength of the Magnetically Enhanced Reactive Ion Etch plasma.

9. The method of claim 8 wherein the first radio frequency power is about 500 to about 1000 watts and the first magnetic field strength is about 20 to about 160 gauss.

10. The method of claim 8 wherein the second radio frequency power is about 200 to about 1000 watts and the second magnetic field strength is about 20 to about 160 gauss.

11. The method of claim 8 wherein the multiplicity of intermediate etching steps is initiated by a reduction in the first radio frequency power.

12. The method of claim 8 wherein the multiplicity of intermediate etching steps is initiated by a reduction in the first magnetic field strength.

13. The method of claim 8 wherein the aluminum containing metal layer has a thickness from about 0.3 to about 1.5 microns.

14. The method of claim 13 wherein the aluminum containing metal layer has a composition from about 90 to about 100 percent aluminum.

15. The method of claim 14 wherein the aluminum containing metal layer is etched with a chlorine containing reactive ion etch plasma.

16. The method of claim 15 wherein the chlorine containing reactive etch plasma is comprised of chlorine gas at about 10 to about 200 standard cubic centimeters per minute and boron trichloride gas at about 10 to about 200 standard cubic centimeters per minute.

17. The method of claim 16 wherein the chlorine containing reactive ion etch plasma further comprises a non-reactive diluent gas.

18. The method of claim 17 wherein the non-reactive diluent gas is nitrogen gas at about 0 to about 150 standard cubic centimeters per minute.

19. A method for forming a residue free patterned aluminum containing metal layer for semiconductor device applications comprising:

forming an aluminum containing metal layer upon a semiconductor substrate;

providing a layered etch mask over the aluminum containing metal layer, which mask protects portions of the aluminum containing metal layer which are to remain on the semiconductor substrate;

providing a primary etching of the aluminum containing metal layer exposed through the etch mask through the use of an Electron Cyclotron Resonance etch plasma, the primary etching being controlled by a first radio frequency power and a first magnetic field strength of the Electron Cyclotron Resonance etch plasma;

providing a multiplicity of intermediate etching steps of the aluminum containing metal layer exposed through the etch mask by sequentially and independently lowering the first radio frequency power and the first magnetic field strength of the Electron Cyclotron Resonance etch plasma to a second radio frequency power and a second magnetic field strength of the Electron Cyclotron Resonance etch plasma; and providing a secondary over-etching of the aluminum containing metal layer exposed through the etch mask at the second radio frequency power and the second magnetic field strength of the Electron Cyclotron Resonance etch plasma.

20. The method of claim 19 wherein the first radio frequency power is about 20 to about 100 watts and the first magnetic field strength is about 20 to about 160 gauss.

21. The method of claim 19 wherein the second radio frequency power is about 20 to about 100 watts and the second magnetic field strength is about 20 to about 160 gauss.

* * * * *